US010275042B2

(12) United States Patent
Kubota

(10) Patent No.: US 10,275,042 B2
(45) Date of Patent: Apr. 30, 2019

(54) TEXT INPUT KEYBOARD

(71) Applicant: Masashi Kubota, Matsudo (JP)

(72) Inventor: Masashi Kubota, Matsudo (JP)

( * ) Notice: Subject to any disclaimer, the term of this patent is extended or adjusted under 35 U.S.C. 154(b) by 0 days.

(21) Appl. No.: 15/320,346

(22) PCT Filed: Jun. 4, 2015

(86) PCT No.: PCT/JP2015/002824
§ 371 (c)(1),
(2) Date: Dec. 20, 2016

(87) PCT Pub. No.: WO2016/006156
PCT Pub. Date: Jan. 14, 2016

(65) Prior Publication Data
US 2017/0351340 A1    Dec. 7, 2017

(30) Foreign Application Priority Data

Jul. 7, 2014   (JP) .................. 2014-139378

(51) Int. Cl.
| G06F 3/02 | (2006.01) |
| G06F 3/023 | (2006.01) |
| H03M 11/06 | (2006.01) |
| H03M 11/14 | (2006.01) |
| G06F 3/01 | (2006.01) |
| G06F 3/0488 | (2013.01) |

(52) U.S. Cl.
CPC ............ *G06F 3/0216* (2013.01); *G06F 3/018* (2013.01); *G06F 3/023* (2013.01); *G06F 3/0219* (2013.01); *G06F 3/0233* (2013.01); *G06F 3/04886* (2013.01); *H03M 11/06* (2013.01); *H03M 11/14* (2013.01)

(58) Field of Classification Search
CPC ..................................... G06F 3/0216
USPC ........................................ 400/489
See application file for complete search history.

(56) References Cited

U.S. PATENT DOCUMENTS

| 3,712,444 A | 1/1973 | Frost |
| 3,847,263 A | 11/1974 | X |
| 4,449,839 A | 5/1984 | Bleuer |
| 4,913,573 A | 4/1990 | Retter |
| 5,334,976 A * | 8/1994 | Wang .......... B41J 5/10 341/22 |
| 5,584,588 A | 12/1996 | Harbaugh |
| 5,620,267 A * | 4/1997 | Klauber .......... G06F 3/0219 400/486 |

(Continued)

FOREIGN PATENT DOCUMENTS

| CN | 102221896 | 10/2011 |
| EP | 1782170 | 5/2007 |

(Continued)

OTHER PUBLICATIONS

"Existing Text Input Methods" Jan. 30, 2018 link: http://www.sis.uta.fi/~pi52316/g/node6.html.

(Continued)

*Primary Examiner* — Anthony H Nguyen
(74) *Attorney, Agent, or Firm* — Mark M. Friedman

(57) ABSTRACT

The character input keyboard. One shift key and one space key are placed on the home position of the left and right thumb, and one control key is placed between them. These keys have the width from 1 to 1.5 times of the character key.

9 Claims, 3 Drawing Sheets

(56) References Cited

U.S. PATENT DOCUMENTS

| | | | |
|---|---|---|---|
| 5,818,437 A | 10/1998 | Grover | |
| 5,861,821 A | 1/1999 | Kato | |
| 6,198,474 B1* | 3/2001 | Roylance | G06F 3/0219 341/22 |
| 6,241,406 B1 | 6/2001 | Yani | |
| 6,558,056 B2* | 5/2003 | Euley | G06F 3/0202 400/489 |
| 6,712,534 B2* | 3/2004 | Patel | G06F 3/021 341/72 |
| 6,876,312 B2 | 4/2005 | Yu | |
| 6,900,794 B1 | 5/2005 | San | |
| 7,083,342 B2 | 8/2006 | Griffin | |
| 7,202,853 B2 | 4/2007 | Tan | |
| 7,287,921 B2 | 10/2007 | Lee | |
| 7,504,967 B2 | 3/2009 | Griffin | |
| 7,506,252 B2* | 3/2009 | Blumberg | G06F 3/0237 341/22 |
| 7,724,157 B1 | 5/2010 | Gray | |
| 8,226,308 B1 | 7/2012 | Borg | |
| 8,562,437 B2 | 10/2013 | Matsuda et al. | |
| 8,858,102 B2* | 10/2014 | Jiang | G06F 3/0213 400/472 |
| 9,335,837 B2 | 5/2016 | Li | |
| 2001/0013859 A1* | 8/2001 | Roylance | G06F 3/0219 345/168 |
| 2003/0201915 A1 | 10/2003 | Montiel | |
| 2003/0206122 A1 | 11/2003 | Emerson | |
| 2003/0218599 A1 | 11/2003 | Burke | |
| 2004/0069600 A1* | 4/2004 | Xie | G06F 3/0216 200/5 R |
| 2004/0239533 A1* | 12/2004 | Bollman | G06F 1/1626 341/22 |
| 2005/0191108 A1 | 9/2005 | Pletikosa | |
| 2006/0176283 A1 | 8/2006 | Suraqui | |
| 2009/0146958 A1 | 6/2009 | Baseflug | |
| 2010/0040400 A1 | 2/2010 | Hirsch | |
| 2010/0090872 A1* | 4/2010 | Satou | G06F 3/0216 341/22 |
| 2010/0194692 A1* | 8/2010 | Orr | G06F 3/0414 345/173 |
| 2011/0206437 A1 | 8/2011 | Baker | |
| 2011/0216006 A1 | 9/2011 | Litschel | |
| 2012/0176310 A1* | 7/2012 | Nair | G06F 3/0213 345/157 |
| 2013/0002561 A1 | 1/2013 | Wakasa | |

FOREIGN PATENT DOCUMENTS

| | | |
|---|---|---|
| EP | 1832956 A1 | 9/2007 |
| GB | 2465729 A | 6/2010 |
| JP | 61-100859 | 5/1986 |
| JP | 3235112 | 10/1991 |
| JP | 3727399 B2 | 2/2000 |
| JP | 62-84323 | 3/2001 |
| JP | 2003-505777 | 2/2003 |
| JP | 2003505777 | 2/2003 |
| JP | 2013025328 A | 2/2013 |
| WO | 20100355574 | 4/2010 |

OTHER PUBLICATIONS

Mikey Campbell "Apple granted patent for predictive text input UI", AppleInsider, Jul. 31, 2012. link:http://appleinsider.com/articles/12/07/31/apple_granted_patent_for_predictive_text_input_ui.

Surur "Microsoft applied for its own patent for a keyboard with secondary screen to ease text entry" MSPoweruser, Nov. 22, 2016 link: https://mspoweruser.com/microsoft-appplied-patent-keyboard-secondary-screen-ease-text-entry/.

* cited by examiner

TEXT INPUT KEYBOARD

TECHNICAL FIELD

The present invention concerns a physical keyboard for a word processor or a personal computer or the like, and concerns a software keyboard on the touch panel screen of a tablet computer, which is used to input characters.

TECHNICAL BACKGROUND

The personal computer keyboard commonly used in the English-speaking area, is consisting of five rows of character keys, and at the center of the bottom row, there is a large space key which have several times width of a general character key. Shift keys and control keys are placed on the outer edges of the character key column, and designed to be co-operated with the little finger of the opposite side to the hand which stretch the character key (FIG. 5). Such key arrangement is taken over from the design of the mechanical typewriter which was dominant in the 19th century.

Also in the JIS (Japanese Industrial Standards) keyboard for input Japanese, the space key is placed in the bottom center of the character key column, typically have 2 or more times width of a general character key. The placement of shift keys and control keys of the JIS keyboard is in compliance with that of the keyboard for English (FIG. 6).

In contrast, in the Utility Model 61-42176 and JP-B-63-49262, as the keyboard for the Japanese word processor, so-called "thumb shift keyboard" was proposed. In the thumb shift keyboard, the thumb shift keys are placed in the position where 2 thumbs are passively placed when other fingers touch their home position of the general key operation of keyboards. Hereinafter, these 2 position of thumbs are referred as the home positions of the thumbs. In the thumb shift keyboard, an operator can input three characters with the single character key by co-push with the 2 thumb shift keys.

In the common English keyboard, which has the key arrangement called "QWERTY layout", the home position of each finger is as follows: the left little finger is on A key, the left ring finger is on S key, the left middle finger is on D key, the left index finger is on F key. And the right index finger is on J key, the right middle finger is on K key, the right ring finger is on L key, the right little finger is on; key. When a Japanese man of average size hands places his each finger on the home position, his left thumb will generally be located in front of V key, and his right thumb will generally be located in front of N key. Therefore, if expressed with the QWERTY layout, the home position of the thumbs in the present invention is defined as follows: the home position of the left thumb is the area in contact with the lower end of V key, and that of the right thumb is the area in contact with the lower end of N key.

In the thumb shift keyboard, the key which placed on the home position of each thumb, has more than double width of that of character key. Adding that, in the thumb shift keyboard, there are two shift keys and two control keys, apart from the two thumb shift keys for Japanese. These keys are arranged on the outer edge of the character key columns, similarly to the arrangement in the English keyboard (FIG. 7).

Since the 1990's, the mainstream of Japanese input device has transferred to the personal computer from the word processor, and several keyboard arrangements for the personal computer were devised, which have the feature of the thumb shift keyboard, prepare the independence keys to the home position of each thumb. In U.S. Pat. No. 4,894,032, "the keyboard, based on the commonly used JIS Kana array keyboard, the space key split in the middle, the half of that is for enter/return key" was devised. Also in U.S. Pat. No. 5,209,812, "the keyboard which has the split space key, the half of that is for henkan function and the other half is for muhenkane function" was devised.

However, both of these two invention have the neither idea, "by limiting the width of the key placed on the home position of the thumb, making it possible to place the another key in the middle of them, and making it easy to operate with touch typing these three keys and two keys at the right and left side of them", nor "by changing the arrangement of shift keys and control keys, making it easy to co-operate with other keys".

PRIOR ART

Patent Document

[Patent Document 1] Utility Model 61-42176
[Patent Document 2] JP-B-63-49262
[Patent Document 3] U.S. Pat. No. 4,894,032
[Patent Document 4] U.S. Pat. No. 5,209,812

SUMMARY OF THE INVENTION

An Object to Solve by the Invention

From the sight of the efficiency of input characters by the keyboard for a personal computer, shift keys and control keys, which are designed for simultaneous keying of the other keys, are better to be placed in the home position of the thumbs or near. Because, even though the thumb push the shift key or the control key at the home position or near, there is little influence to the positioning of the other fingers, so it does not heavily restrict the keying of the other fingers.

However, at present in almost all keyboards of the personal computers on the market, every shift key and control key is arranged at the position which should be typed by the little finger outside its home position. As the result of the such arrangement, shift keys and control keys should be placed both on the right and left side, and it makes difficult to co-operate the shift key and the control key with the other key, causes a decrease in the efficiency of the input work. The present invention is intended to solve these problems. That is, problem of efficiency reduction of the input work caused by such irrational key arrangement of the keyboard for a personal computer or the like.

In Order to Solve the Problem

In the present invention, to solve the problems above, the width of the space key which occupies a too large area than necessary in the keyboard of an existing personal computer, is limited to 1 or 1.5 times of the width of the other character key. And the space key is placed in the home position of the left thumb or the right thumb. The shift key with the width from 1 or 1.5 times of the other character key is placed in the other home position of the thumb. In the space between the home position of the left thumb and the right thumb, caused by limiting the width of these two keys, the control key is placed. In the outside of the home position of both thumbs, other keys are placed.

Effect of the Invention

The key arrangement above, makes it possible to operate the five keys of the keyboard, two keys at the home position of thumbs, one key at the intermediate of them, and two keys at the outside of them, easily and without looking keys.

Because the one shift key and the one control key are placed on the position where can be operated by the thumbs with little influence to the positioning of other fingers, the usability of simultaneous key operation with the shift key or the control key and the other keys are improved.

Because the one shift key and the one control key are placed on the position where can be operated by the thumbs, it becomes possible to omit the shift keys and the control keys on the outside of the character keys. By placing the other function keys at these positions, for example the delete key or the escape key, the total operability of the keyboard is improved.

Because of the increase of the number of the key around the home positions of the thumbs, it is enable to assign the function keys such as the direction keys or the enter key, which are frequently used in the Japanese input application, MS-IME (Microsoft Corporation, registered trademark), Google Japanese input (Google Inc., registered trademark), ATOK (Just Systems Corporation, registered trademark) etc. These keys are now located too far from the home positions of the fingers as their importance. This change of the key arrangement improves the efficiency of the input work.

The placement of the shift key in the present invention, makes it easy to use the simultaneous key operation of the shift key and the character key, which is used only a little in the Japanese input work. Utilizing that improves the efficiency of the Japanese input work. (FIG. 3).

Because of the morphological feature "setting the independent keys on the home position of thumbs", the present invention is suitable for the virtual thumb shift keyboards with so called the key remapper (An application to customize the key arrangement of the keyboard).

BRIEF DESCRIPTION OF THE DRAWINGS

FIG. 4 The plan view showing the embodiment of the present invention. (Example 4)

FIG. 5 The plan view showing a typical key arrangement of the English keyboard for a personal computer.

FIG. 6 The plan view showing a typical key arrangement of the Japanese keyboard for a personal computer.

DETAILED DESCRIPTION OF THE INVENTION

FIG. 1, FIG. 2, FIG. 3 and FIG. 4 show an embodiment of the present invention. In either embodiment, there are one space key and one shift key on the home position of thumbs, and one control key between them. In the present invention, the width of these three keys are all from 1 to 1.5 times of the width of the character key. The length of the longitudinal direction of these keys and the shape of the keys outside of the thumb home position, are not included in the claim of the present invention.

The arrangement of Alphabet or kana keys, and the arrangement of number keys are not included in the claim of the present invention. The arrangement of function keys, excluding the three keys on the home positions of the left thumb and the right thumb and in the middle of them, is not included in the claim of the present invention, neither.

Example 1

Figure 1:
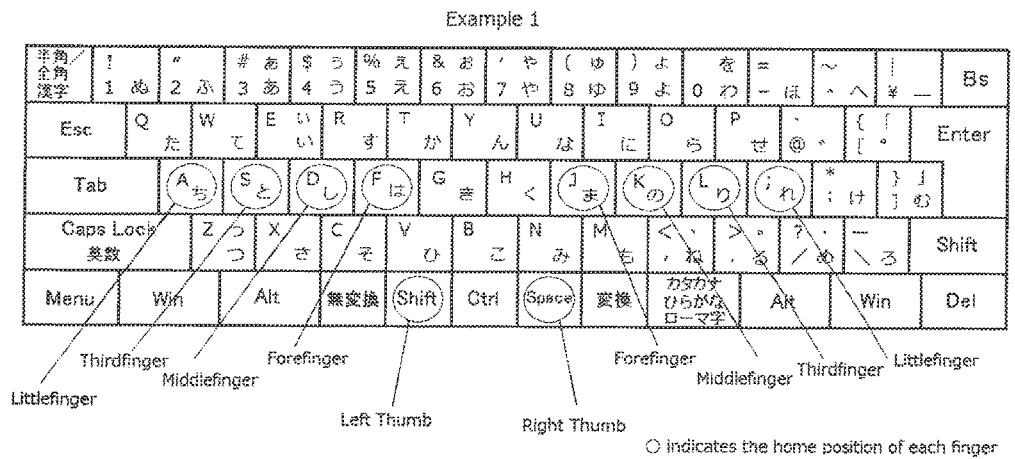
FIG. 1 The plan view showing the embodiment of the present invention. (Example 1)

FIG. 1 is the example of the embodiment of the present invention in the Japanese keyboard for a personal computer. In this example, the shift key is placed on the home position of the left thumb, the space key is placed on the home position of the right thumb, and the control key is placed between them. In addition, two control keys generally to be placed in the outer edge of the character key column, and one shift key generally to be placed in the left outer edge of the character key column, are omitted. The key placed on the outside of the home position of the left thumb is Muhenkan key, and the key placed on the outside of the home position of the right thumb is Henkan key. The width of the three keys located in the home position of the left and right thumb and between them, are nearly 1 time of that of character key.

Example 2

Figure 2:
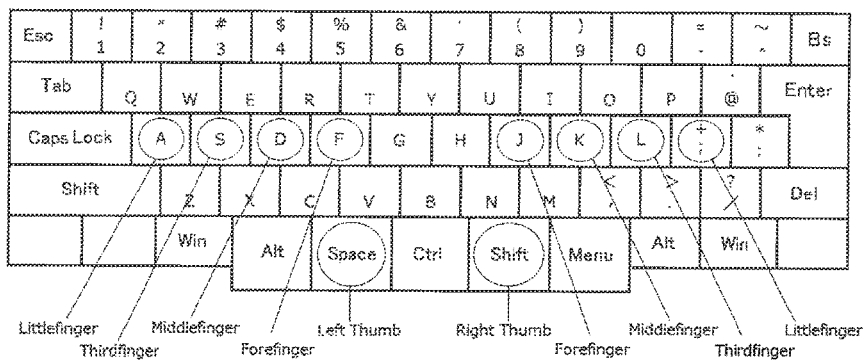
FIG. 2 The plan view showing the embodiment of the present invention. (Example 2)

FIG. 2 is the example of the embodiment of the present invention in the English keyboard for a personal computer. In this example, the shift key is placed on the home position of the right thumb, the space key is placed on the home position of the left thumb, and the control key is placed between them. In addition, two control keys generally to be placed in the outer edge of the character key column, and one shift key generally to be placed in the right outer edge of the character key column, are omitted. The key placed on the outside of the home position of the left thumb is Alt key, and the key placed on the outside of the home position of the right thumb is Menu key. The width of three keys located in the home positions of the left and right thumbs and between them, are nearly 1.3 times of that of character key.

Example 3

Figure 3:
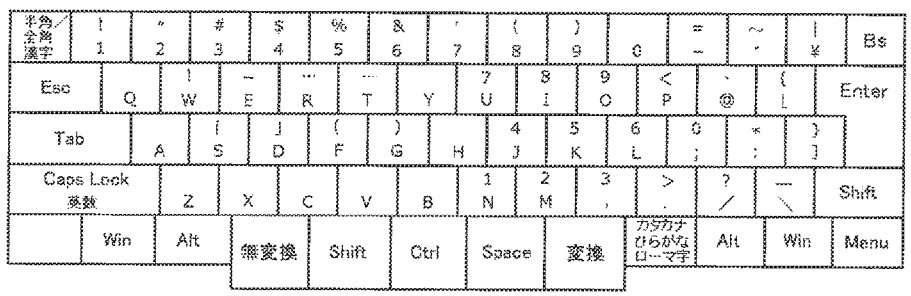
FIG. 3 The plan view showing the embodiment of the present invention. (Example 3)
Figure 7:
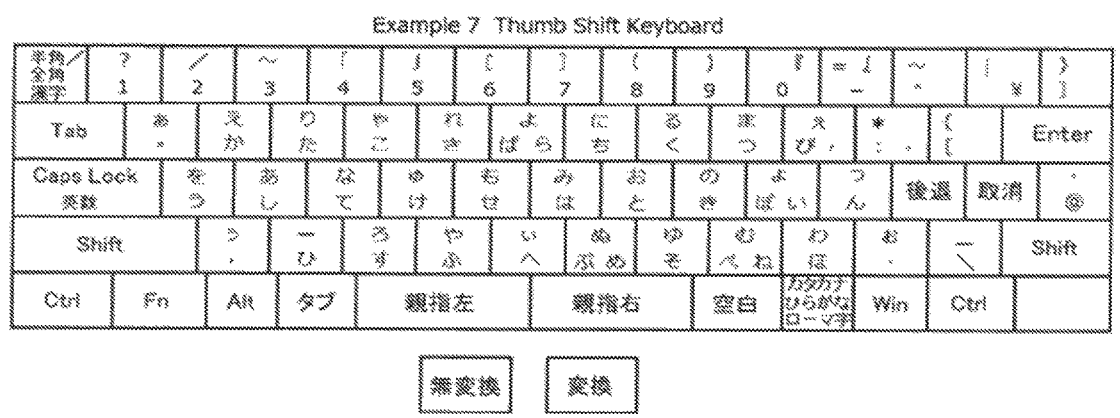
FIG. 7 The plan view showing an embodiment of the patent JP-B-63-49262 (so called the thumb shift keyboard).

FIG. 3 is the example of the embodiment of the present invention in the Japanese keyboard for a personal computer. In this example, the key remapper, the application to customize the key arrangement of the keyboard which is provided for a fee or free of charge over the Internet, is applied to improve the efficiency of Japanese input work. The letter or the symbol input by the single typing of the key is illustrated in the center of the top of each key, and the characters or symbols input by the simultaneous keystrokes with the shift key are illustrated in the lower part of the key. In Japanese input work, when using Roman characters with the the common QWERTY layout, the operator is forced to do difficult key operation, because it is essential to use the uppermost line of the character key column, in order to input number, dash or bracket. In this example, by using the key remapper, numbers, dash and bracket and the like are designed to be input by the simultaneous keystrokes with the shift key, and become easy to be input.

Example 4

Figures 4, 5, 6:
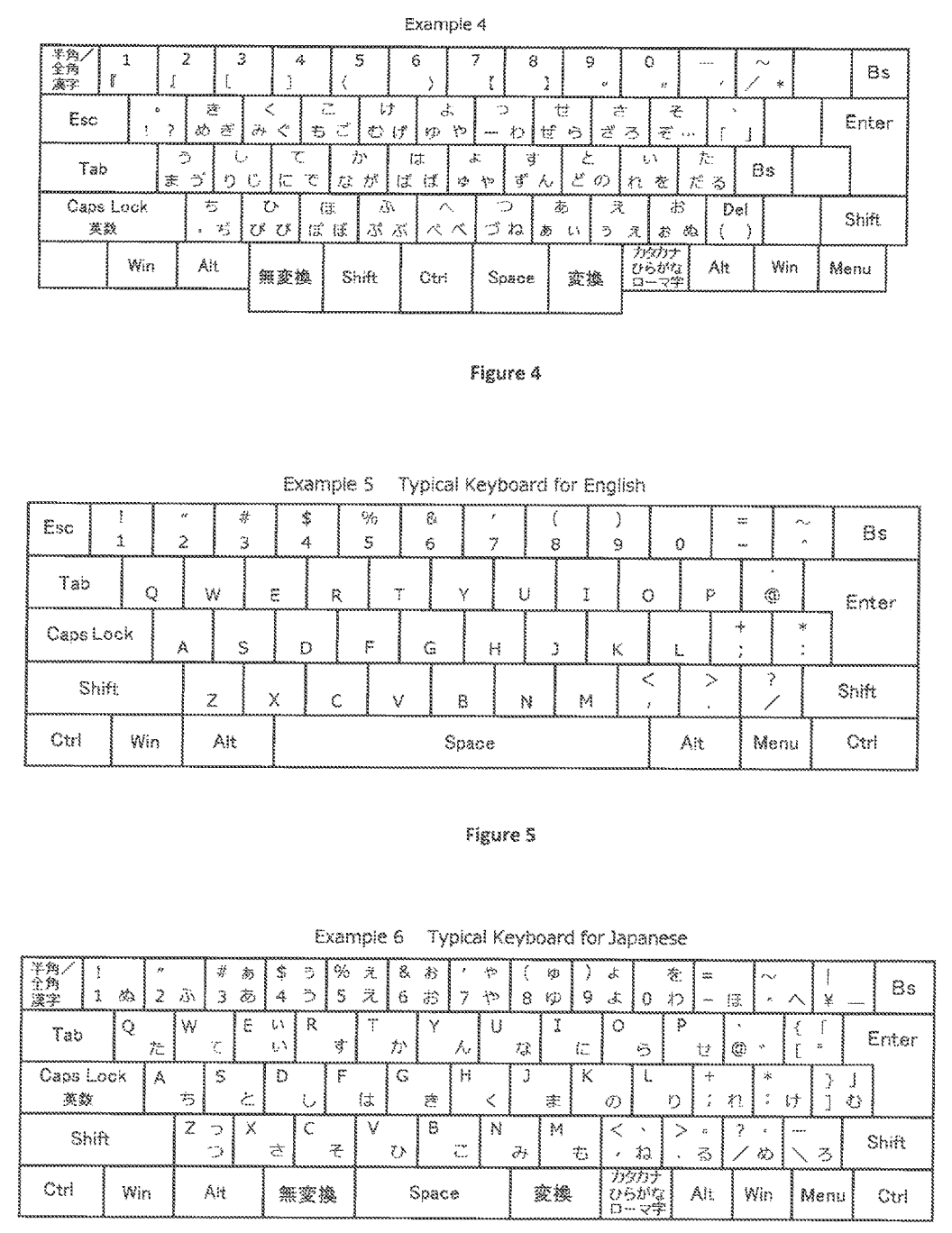

FIG. 4 is the example of the embodiment of the present invention in the Japanese keyboard for a personal computer. By using the key remapper, a virtual thumb shift keyboard is realized. The letter or the symbol input by the single keystroke is illustrated in the center of the top of each key, and in the lower part of the same key, the character or symbol input by the simultaneous keystrokes with the left shift key is in the left side, with the space key is in the right side. The arrangement of letters and symbols is devised by the inventor of the present invention, provided for illustrative purpose.

INDUSTRIAL APPLICABILITY

The keyboard for input characters produced with the present invention provides convenience immediately for anyone uses a personal computer or a word processor or the like. If one has some experience to use existing keyboard for a personal computer, it requires no training nor learning to operate it. The present invention is able to be applied not only for the physical keyboard, but for the software keyboard on a tablet computer equipped with a touch panel, etc. The present invention improves only the efficiency of the input work by any language. The industrial applicability of the present invention is extremely high.

The invention claimed is:
1. A keyboard apparatus comprising;
multiple keys, each key corresponding to one of a character, letter, number, function, and a command, arranged in a plurality of rows of continuous keys comprising;
a first row including at least eight keys, each key of the eight keys defining a home position for each one of eight fingers of a user of the keyboard, and,
a second row beneath the first row, the second row including the plurality of keys;
a third row beneath the second row, the third row including a shift key, a space key and a control key of variable widths, wherein the space key, the control key, and the shift key are arranged centrally in the third row,
wherein the control key is between the shift key and the space key.
2. The keyboard apparatus of claim 1, wherein when engaged in English language typing, the first row is such that the home position for each of the eight fingers of the user are designated as:
key A for left little finger, key S for left ring finger, key D for left middle finger, key F for left index finger, key J for right index finger, key K for right middle finger, key L for right ring finger and the right adjacent character key to key L for the right little finger.
3. The keyboard apparatus of claim 1, wherein the shift key and control key positions are interchangeable with each other.
4. The keyboard apparatus of claim 1, wherein the shift key is configured such that activation thereof enters one of a number, an alphabet, or a character through the same character key.
5. The keyboard apparatus of claim 1, wherein said keyboard is implemented in software in touch screen based devices.
6. The keyboard apparatus of claim 1, wherein said keyboard includes a virtual keyboard implemented through software.
7. The keyboard apparatus of claim 1, wherein said keyboard includes keys operable in multiple languages by activation of the shift key.
8. The keyboard apparatus of claim 1, wherein the usage of keys are adapted to be customized by a key remapper function.
9. A keyboard apparatus, comprising:
multiple keys, each key corresponding to one of a character, letter, number, function, and a command, arranged in a plurality of rows of continuous keys comprising;
a first row including at least eight keys, each key of the eight keys defining a home position for each one of eight fingers of a user of the keyboard, and,
a second row beneath the first row, the second row including the plurality of keys;
a third row beneath the second row, the third row including a shift key, a space key and a control key of variable widths, wherein the space key, the control key, and the shift key are arranged centrally in the third row,
wherein the control key is 1) adjacent to the shift key, and, 2) adjacent to the space key.

* * * * *